(12) United States Patent
Firth et al.

(10) Patent No.: US 6,718,224 B2
(45) Date of Patent: Apr. 6, 2004

(54) SYSTEM AND METHOD FOR ESTIMATING ERROR IN A MANUFACTURING PROCESS

(75) Inventors: Stacy Firth, Salt Lake City, UT (US); W. Jarrett Campbell, Cary, NC (US)

(73) Assignee: Yield Dynamics, Inc., Santa Clara, CA (US)

(*) Notice: Subject to any disclaimer, the term of this patent is extended or adjusted under 35 U.S.C. 154(b) by 176 days.

(21) Appl. No.: 09/956,550

(22) Filed: Sep. 17, 2001

(65) Prior Publication Data

US 2003/0055524 A1 Mar. 20, 2003

(51) Int. Cl.⁷ .......................... G06F 19/00; H01L 21/00
(52) U.S. Cl. .............................. 700/121; 700/110; 438/5
(58) Field of Search ............................... 700/109, 110, 700/121; 438/5

(56) References Cited

U.S. PATENT DOCUMENTS

| | | | | |
|---|---|---|---|---|
| 5,761,093 A | * | 6/1998 | Urbish et al. ................ 700/107 |
| 5,973,766 A | * | 10/1999 | Matsuura et al. .............. 355/52 |
| 6,197,604 B1 | | 3/2001 | Miller et al. |
| 6,230,069 B1 | | 5/2001 | Campbell et al. |
| 6,459,941 B1 | * | 10/2002 | Lobb et al. .................... 700/90 |
| 6,460,002 B1 | * | 10/2002 | Bone et al. .................... 702/81 |
| 6,535,774 B1 | * | 3/2003 | Bode et al. .................... 700/109 |
| 2002/0177917 A1 | * | 11/2002 | Polla et al. ................. 700/108 |
| 2003/0014145 A1 | * | 1/2003 | Reiss et al. ................. 700/121 |
| 2003/0040830 A1 | * | 2/2003 | Parikh et al. ............... 700/121 |
| 2003/0199108 A1 | * | 10/2003 | Tanaka et al. ................ 438/14 |

OTHER PUBLICATIONS

Stuber, J., et al.; Device Dependant Run–to–Run Control of Transistor Critical Dimension by Manipulating Photolithography Exposure Settings; pp. 1–21; Proceedings of the AEC/APC Symposium XII (Sep. 2000).

* cited by examiner

Primary Examiner—Leo Picard
Assistant Examiner—Elliot Frank
(74) Attorney, Agent, or Firm—Gray Cary Ware & Freidenrich LLP

(57) ABSTRACT

A system and method for estimating errors within a semiconductor fabrication process. The system identifies an optimal number of error components based upon relevant context items. The system further estimates the error within the fabrication process and attributes portions of the error to each of the identified error components based upon feedback data received from the manufacturing process.

23 Claims, 2 Drawing Sheets

SYSTEM AND METHOD FOR ESTIMATING ERROR IN A MANUFACTURING PROCESS

FIELD OF THE INVENTION

The present invention generally relates to a system and method for estimating error in a manufacturing process and more particularly, to a system and method which estimates the error between a control model and a semiconductor manufacturing process and which attributes each portion of the error to a specific contributing context item.

BACKGROUND OF THE INVENTION

Semiconductors are made in production facilities, commonly referred to as "fabs." A large fab may contain hundreds of automated tools that cooperatively work to convert circular silicon "wafers" (each consisting of dozens, hundreds, and even potentially thousands of chips) into functioning products. One of the challenges in these fabs is to control the manufacturing tools and equipment in a manner which minimizes variation and defects in the products being produced. The manufacturing equipment and tools used within these fabs, such as steppers and scanners, have a multitude of parameters which must be examined and controlled in order to minimize these variations and errors.

In addition to the errors caused by manufacturing equipment and tools, variations in product quality are often functions of the particular lot of products or wafers being processed. As a result, prior control systems for operating the manufacturing tools and processes have often been designed to use feedback data from lots that include the same type of product and that are in the same "streamline" (i.e., products that have experienced the same upstream process flow as the lot currently being processed). However, in fabs producing a relatively diverse variety of products or "high-mix" fabs, certain feedback data loops may operate with hours or even days between data points in the feedback loop. Process tool disturbances that occur during this "downtime" are not captured in the feedback data. As a result, these delays may cause a loss of information regarding the manufacturing tools' respective contributions to the variance in a specific product.

Moreover, prior fabrication control systems do not partition the error into its contributing context items or component parts, such as the specific error components related to the current and previous manufacturing tools and reticles that were used on a product. That is, these conventional systems only generally identify an overall or cumulative error, and do not provide information as to the various elements or items which cooperate to produce the error. Hence, the ability to optimize the manufacturing process and to provide corrective measures to prevent errors in future fabrications or processes is substantially limited.

Some efforts have been made to partition manufacturing errors into their respective components through the use of a conventional sliding mode control law (e.g., a control law implementing a sliding gain). These efforts have had limited success. Particularly, these prior methods have only been capable of identifying two context items. Furthermore, the sliding gains utilized within these prior methods result in a loss of information in one or more individual components of the error estimate, which increases as the sliding gain approaches zero (i.e., as more and more lots are processed through the system).

It is therefore desirable to provide a system and method for estimating error within a semiconductor fabrication process, which overcomes the drawbacks and limitations of prior systems and methods, which estimates the error between a control model and a semiconductor manufacturing process, and which attributes each portion of the error to a specific contributing context item.

SUMMARY OF THE INVENTION

The present invention provides many advantages over conventional error estimation methods and systems. By way of example and without limitation, the present invention accurately estimates the error within a semiconductor manufacturing process and attributes each portion of the error to a specific contributing context item (i.e., a specific component that contributes to the overall error). Furthermore, in one non-limiting embodiment, the present invention is effective to partition the overall error into four separate contributing context items. Moreover, the present invention does not require the use of a sliding gain and continues to re-estimate all components of variation throughout the application of the method.

According to one aspect of the present invention, a control system is provided for a manufacturing process. The control system includes a first portion which identifies a plurality of error components based upon data describing a lot of products being processed, and which estimates values for each of the error components based upon manufacturing feedback data; and a second portion which communicates with the first portion and which receives the estimated values from the first portion and utilizes the estimated values to control the manufacturing process.

According to a second aspect of the present invention, a system is provided for estimating errors within a semiconductor fabrication process. The system includes a controller which is adapted to receive context data, process data and numeric data regarding the semiconductor fabrication process, and which is further adapted to identify an optimal number of error components based upon the context data, and to estimate a value for each of the error components based upon the process data and numeric data.

According to a third aspect of the present invention, a method is provided for estimating errors in a semiconductor manufacturing process. The method includes the steps of: obtaining context items data describing a lot of wafers being processed; identifying a plurality of error components based upon the context items data; obtaining process data describing the manufacturing process; obtaining numeric data describing post-processing measurements taken on the lot of wafers; and estimating values for each of the plurality of error components by use of the process data and numeric data.

These and other features and advantages of the invention will become apparent by reference to the following specification and by reference to the following drawings.

DETAILED DESCRIPTION OF A PREFERRED EMBODIMENT OF THE INVENTION

The present invention provides a system and method for estimating error in a manufacturing process and for attributing the error to a plurality of component parts. In the preferred embodiment, the present invention comprises and/or resides within the observer portion of a run-to-run control system that controls the overall operation of a semiconductor manufacturing process. Particularly, the invention may be implemented within and/or form a portion of the software and/or hardware which forms the manufacturing control system.

Figure 1:
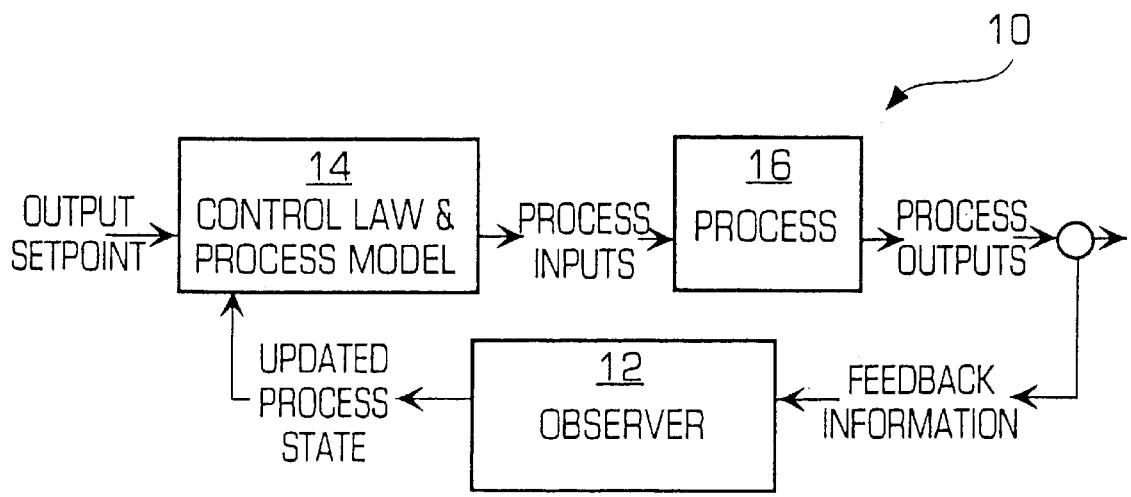
FIG. 1 is a block diagram illustrating a semiconductor fabrication control system in accordance with a preferred embodiment of the present invention.

Referring now to FIG. 1, there is shown a control system 10 that includes an observer portion or module 12 in accordance with a preferred embodiment of the present invention. As should be appreciated by one of ordinary skill in the art, control system 10 is a run-to-run control system. Control system 10 may represent one or more conventional and commercially available controllers, computers, manufacturing execution systems, or independent microprocessor-based systems built specifically for use with the present invention.

As described more fully and completely below, the observer portion or module 12 is adapted to estimate the actual state of the fabrication process, to estimate errors that are correlated with a plurality of contributing context items (i.e., components that contribute to the overall error, such as tool error, reticle error, reference tool error and reference reticle error), and to generate updated process state information. The observer portion 12 then communicates this information to a control law and process model portion 14. The "control law" of portion 14 utilizes the error information from observer portion 12 to determine how the fabrication process or "recipe" should be modified in order to keep the process (e.g., the output of the process or the fabricated devices) on target. The "process model" of portion 14 relates measurable inputs and states to the desired product qualities. Particularly, the process model is used in the control law to determine which recipe parameters, or process inputs, should be adjusted to provide the desired output.

The output from the control law and process model portion 14 (i.e., the process inputs) is communicated to the fabrication process 16 (e.g., to the manufacturing tools performing the fabrication process). The fabrication process 16 is then modified in accordance with the information or process inputs received from portion 14.

The modified process 16 provides process outputs in the form of fabricated or processed products or devices. Data is measured or obtained from the fabricated or processed products and is utilized as feedback information which is communicated to the observer portion 12.

Figure 2:
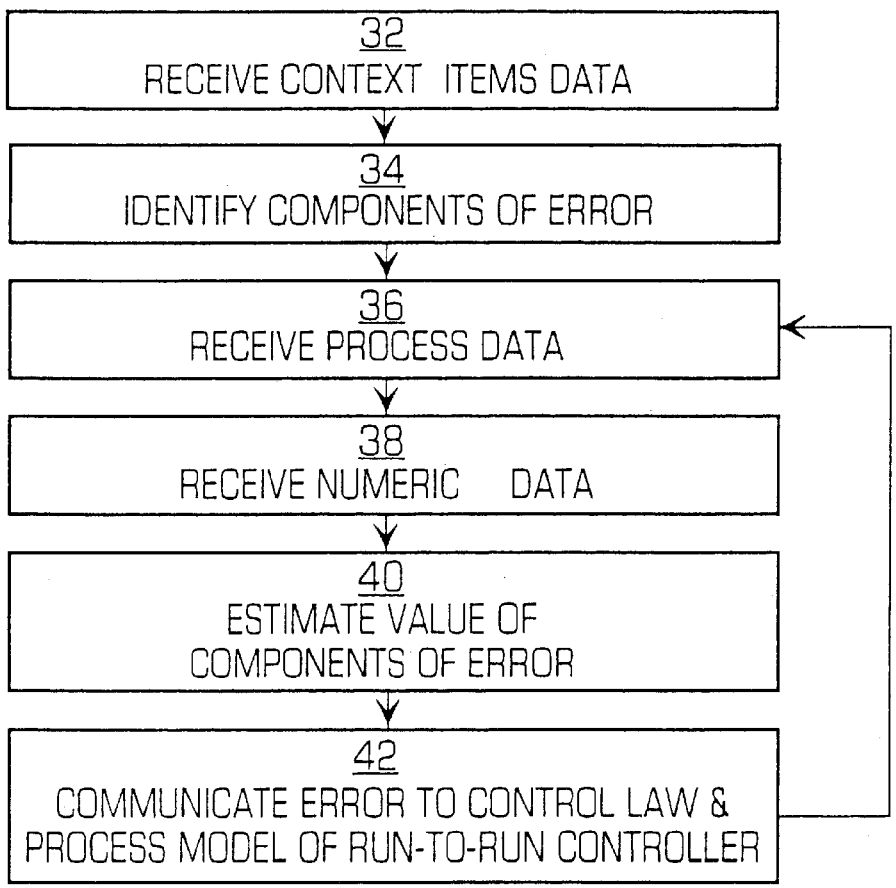
FIG. 2 is a block diagram illustrating the methodology employed by the preferred embodiment of the invention.

To better understand the operation of the preferred embodiment of the invention, reference is now made to FIG. 2. FIG. 2 is a block diagram 30 illustrating the functionality, method or strategy used by the control system 10 to estimate the error or process variation between the control or process model used within the run-to-run control system and the semiconductor fabrication process. The present invention implements a "just-in-time adaptive disturbance estimation" ("JADE") strategy to identify the contributions to variation that are dependent upon a plurality of specific context items or error components. The strategy 30 is briefly executed as follows: the observer portion 12, in a conventional manner, of the control system 10 receives context items data in functional block or step 32; identifies a plurality of error components in functional block or step 34; receives process data in functional block or step 36; receives numeric data in functional block or step 38; estimates the value of the error components for the manufacturing process in functional block or step 40 based upon the received context, process and numeric data; and communicates the error information to the control law and process model portion 14 of the run-to-run controller in functional block or step 42. The function and/or operation of each of the foregoing steps is discussed more fully and completely below.

In functional block or step 32, the observer portion 12 of control system 10 receives context items data regarding the group or lot of wafers that is being processed. The context items data is typically received from a fab's manufacturing execution system, or alternatively, may inputted into system 10 in a conventional manner by a control or manufacturing engineer. The context items data includes data describing the route or flow that a particular lot or group of wafers will follow in the fab (e.g., the sequence of tools and processes that the lot will encounter and undergo), the reticles that will be used on the lot, and other information regarding each lot of wafers being processed.

In functional block or step 34, the observer portion 12 determines an optimal number of error components that will be identified based upon the received context items data. Particularly, the observer portion 12 determines the number and identity of the components of variation or error that will be estimated, based upon the context items data, in a manner that is well-known in the art. As an example, system 10 may be designed for controlling a photolithography overlay process, and may identify the following four contributing error components: tool error (e.g., error relating to the present tool being used on the wafer), reticle error (e.g., error relating to the present reticle being used on the wafer), reference tool error (e.g., error relating to the previous or last tool that was used on the wafer), and reference reticle error (e.g., error relating to the previous or last reticle that was used on the wafer). In other alternate embodiments, different and/or additional error components may be identified based upon the particular process being modeled or controlled.

In functional block or step 36, the observer portion 12 receives data describing the particular processes that the lot of wafers encounters during fabrication. This process data may include information regarding tool and/or machine settings and operating points existing during the fabrication process, such as temperature and pressure settings, spin speeds and other tool and/or machine operating parameters. The process data may be obtained and communicated to the observer 12, in a conventional manner, as feedback from the fabrication tools and/or the manufacturing execution system.

In functional block or step 38, the observer portion 12 receives numeric data representing output measurements from a lot of wafers that are obtained after a processing operation is complete. This numeric data may include by way of example and without limitation, wafer thickness measurements, heights and widths of resident wafer structures, electrical properties of resident wafer elements, and any other relevant parametric data. This data may be obtained by use of conventional sensors and testing devices and may be communicated to observer portion 12 by the sensors, testing devices, manufacturing execution system or in any other suitable manner.

In functional block or step 40, observer portion 12 estimates the value of each of the error components identified in step 34. This estimation is used within the control system's run-to-run process model or algorithm which is represented by the following equation:

$$y_k = \alpha u_k + \epsilon_{tot,k} \qquad \text{Equation (1)}$$

where $Y_k$ is the measured output of the fabrication process for batch k, $u_k$ is the process input based, in a known manner, on previous observations through batch k, $\alpha$ is a predetermined parameter selected to model the relevant fabrication process, and $\epsilon_{tot,k}$ is the total error of the fabrication process, estimated after each lot.

The observer 12 partitions the total error, $\epsilon_{tot,k}$ into its component parts according to the following equation:

$$\varepsilon_{tot} = \sum_i \varepsilon_i \qquad \text{Equation (2)}$$

where the summation is over the identified context items or error components. For example, in an embodiment designed for use with a photolithography overlay process, Equation (2) would be written as follows:

$$\epsilon_{tot} = \epsilon_{tool} + \epsilon_{reticle} + \epsilon_{ref.tool} + \epsilon_{ref.reticle} \qquad \text{Equation (3).}$$

The observer 12 estimates each of the foregoing component errors after each lot of wafers is processed. Observer 12 generates these estimates by use of the following mathematical computations. For p individual context items (e.g., tool, reticle, reference tool and reference reticle in one embodiment) and a sliding window of q observations, a set of linear equations is constructed by use of the following equation:

$$\begin{bmatrix} A_0 \\ \overline{I} \end{bmatrix} \hat{\varepsilon}_{k+1} = \begin{bmatrix} b_0 \\ \overline{\hat{\varepsilon}_k} \end{bmatrix} \qquad \text{Equation (4)}$$

where $\hat{\epsilon}_{k+1}$ is a [p×1] vector of context-based error estimates for the k+1st iteration; $\epsilon_k$ is a [p×1] vector of context-based error estimates for the kth iteration; $A_o$ is a [q×p] "inclusion" matrix of "1s" and "0s" for inclusion of the relevant context items in the total error which is determined based upon the context data; I is a [p×p] identity matrix; and $b_0$ is a vector of measurements (i.e., $y_{k+1}$) provided by the numeric data. In the preferred embodiment, the error estimates $\hat{\epsilon}_k$ may be initialized according to a predetermined hierarchy. Particularly, one error component (e.g., tool error) may be assigned the actual total error value, and the remaining error components may be set to zero. After several iterations, the observer 12 will provide substantially accurate values for all error components.

Equation (4) is modified by the inclusion of a weighting matrix, Q, thereby providing the following equation:

$$QA\hat{\epsilon}_{k+1} = Qb \qquad \text{Equation (5)}$$

where $$A = \begin{bmatrix} A_0 \\ \overline{I} \end{bmatrix}, b = \begin{bmatrix} b_0 \\ \overline{\hat{\varepsilon}_k} \end{bmatrix},$$

and Q is defined by $$Q = \begin{bmatrix} Q_1 & Q_2 \\ \hline Q_3 & Q_4 \end{bmatrix} \qquad \text{Equation (6)}$$

In Equation (6), $Q_1$ is a [q×q] matrix and $Q_4$ is a [p×p] matrix as shown below:

$$Q_1 = \begin{bmatrix} \lambda & 0 & \cdots & 0 \\ 0 & \lambda^2 & & \vdots \\ \vdots & & \ddots & 0 \\ 0 & \cdots & 0 & \lambda^q \end{bmatrix}, \qquad \text{Equation (7)}$$

$$Q_4 = \begin{bmatrix} (1-\lambda) & 0 & \cdots & 0 \\ 0 & (1-\lambda) & & \vdots \\ \vdots & & \ddots & 0 \\ 0 & \cdots & 0 & (1-\lambda) \end{bmatrix}$$

where $\lambda$ is an adjustable tuning parameter, and $Q_2$ and $Q_3$ are matrices of zeros with sizes [q×p] and [p×q], respectively. Equation (5) is solved for the context-based errors using a conventional least-squares estimation, resulting in the following realization of the normal equations:

$$\hat{\epsilon}_{k+1} = (A^T Q^T Q A)^{-1} A^T Q^T Q b \qquad \text{Equation (8)}$$

where the superscript T denotes the matrix transposition function, and the superscript −1 denotes the matrix inversion function.

Equation (8) is solved at each iteration of the control algorithm and in functional block or step 42, observer portion 12 communicates this error information to portion 14 of the control system 10. Control system 10 utilizes this information within the control law of portion 14 which is represented by the following equation:

$$u_k = \frac{T - \hat{\epsilon}_{tot,k}}{\alpha} \qquad \text{Equation (9)}$$

where T is the process target. The control law calculates the recommended process input which is utilized within the manufacturing process 16. The resulting process and numeric data is obtained and provided to the observer 12 as feedback for subsequent iterations.

The foregoing control system 10 was tested in comparison with a traditional streamlined exponentially weighted moving average ("EWMA") system. Particularly, a pair of simulations were performed using the present control system 10 (i.e., the JADE system) and an EWMA system. As shown by the graphs of FIGS. 3–5, the JADE system performed better than the traditional EWMA system.

Figure 3:
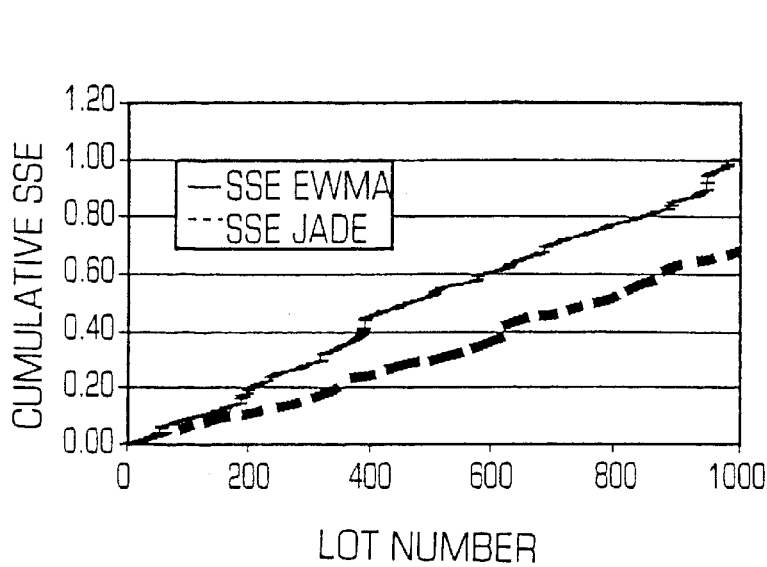
FIG. 3 is a graph of data taken during a first simulation and illustrating the cumulative sum of squares error for a control system employing the present invention and for a control system employing a conventional exponentially weighted moving average ("EWMA") method.
Figure 4:
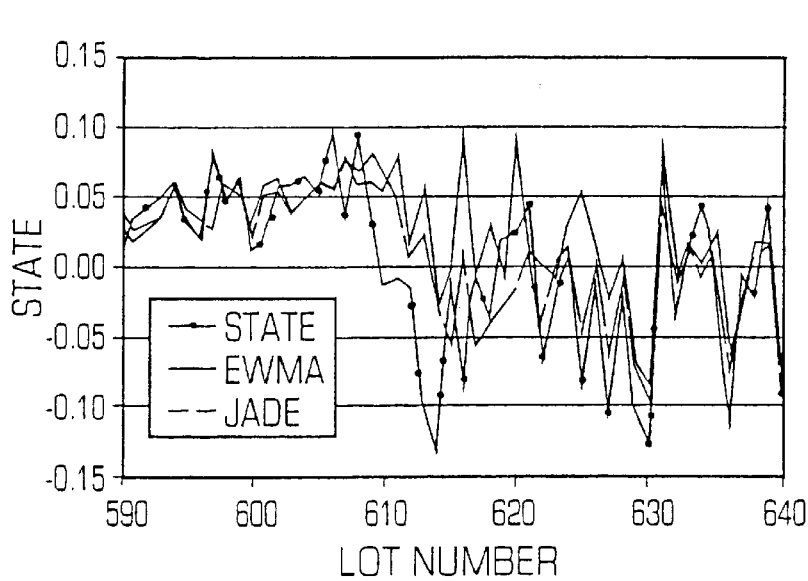
FIG. 4 is a graph of data taken during a first simulation and illustrating the state estimation provided by a control system employing the present invention and by a control system employing a conventional exponentially weighted moving average method.
Figure 5:
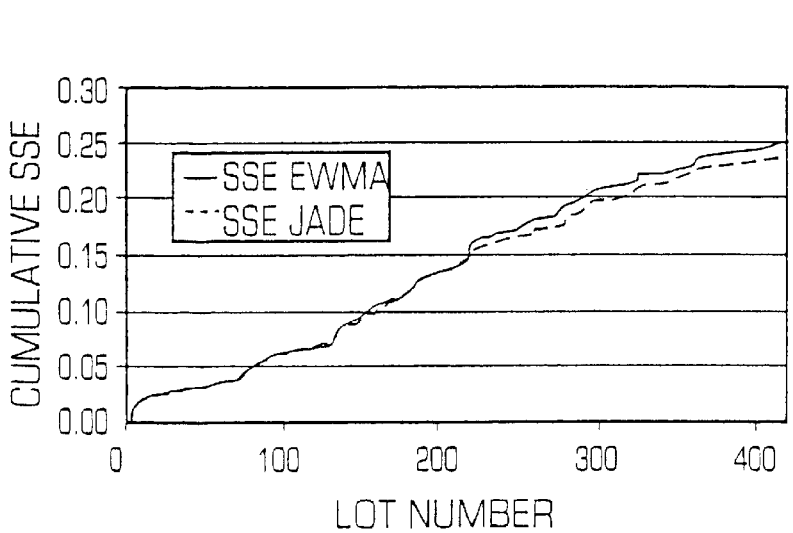
FIG. 5 is a graph of data taken during a second simulation and illustrating the cumulative sum of squares error for a control system employing the present invention and for a control system employing a conventional exponentially weighted moving average method.

Graph 100 of FIG. 3 and graph 110 of FIG. 4 illustrate results obtained during a first simulation. During the first simulation, four context items (i.e., tool, reticle, previous tool and previous reticle) were identified and used, with each context item having two possible values (e.g., two possible tool values, two possible reticle values, two possible previous tool values, and two possible previous reticle values). Additionally, a sliding estimation window of five lots was used. As shown by graph 100, the sum of squares error ("SSE") of the JADE system is substantially less than the SSE of the traditional EWMA system. For example, the final SSE for the EWMA system is approximately 1.01, while the final SSE for the JADE system is approximately 0.68. Moreover, as shown by graph 110 of FIG. 4, the state estimation provided by the JADE system is consistently closer to the actual state of the process than the state estimation provided by the traditional EWMA system.

In the second simulation, two context items (i.e., tool and reticle) were identified and used. The tool context item had two possible values and the reticle context item had three possible values. Additionally, a sliding window of five lots was used. As shown by graph 120 of FIG. 5, the SSE of the JADE system is less than the SSE of the traditional EWMA system. For example, the final SSE for the EWMA system is approximately 0.246, while the final SSE for the JADE system is approximately 0.234.

In the foregoing manner, the present invention accurately estimates the error within a semiconductor manufacturing process and attributes each portion of the error to a specific contributing context item. Hence, the present system and method offer insight into which context items are varying, thereby providing specific guidance for improving the manufacturing process and eliminating variation. The present invention performs state estimation superior to conventional EWMA systems, and has a consistently lower SSE than conventional EWMA systems. Moreover, the present invention does not require the use of sliding gains and continues to re-estimate all components of variation throughout the application of the algorithm.

It should be understood that the inventions described herein are provided by way of example only and that numerous changes, alterations, modifications, and substitutions may be made without departing from the spirit and scope of the inventions as delineated within the following claims.

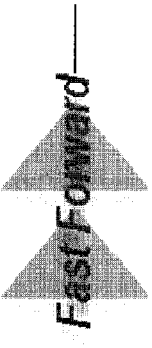
International SEMATECH AEC/APC XII
Device Dependant Run-to-Run Control of Transistor Critical Dimension by Manipulating Photolithography Exposure Settings
John D. Stuber, Francois Pagette, Susan Tang
Texas Instruments, Inc.
DMOS IV Wafer Fab

Introduction

International SEMATECH AEC/APC XII

- Control of gate pattern critical dimension (CD) directly impacts several device parametrics
  - Drive current, threshold voltage, clock speed
- ASIC fabs produce many different products (devices) with different target CD's
  - Devices with same CD target are grouped into a "Technology"
- Each Stepper/Technology pair requires separate control loop
- Tolerance on reticle manufacture induces a reticle bias to printed CD
- Control algorithm must correctly apportion the delta from target in the CD measurement between stepper drift and reticle bias while rejecting SEM measurement noise

CD versus Exposure Model

- The relationship between printed CD and exposure (dose) is linear with offsets for the stepper/technology and for the reticle PCD = M * Exp + B_BASE + B_RETICLE

- M is a negative number for positive type resist
- Magnitude of M varies with type of resist (Technology) and is determined by experiment
- B_BASE values must be initialized by test wafers

DOE for Parameter Estimation
International SEMATECH AEC/APC XII
- Example: Exposure matrix data from different shots on same wafer determines M and initial B_BASE for a particular technology
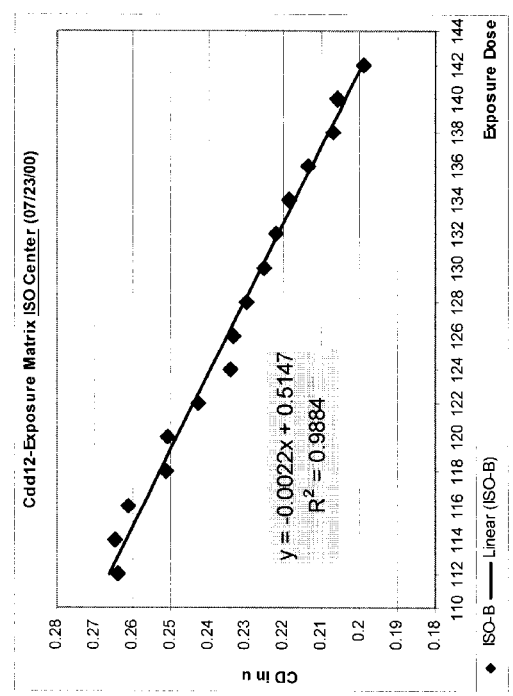

Tuning Model Offsets
International SEMATECH AEC/APC XII
- Tuners based on sliding gains
  B_BASE = B_BASE + BASE_GAIN*(CDERROR)
  B_RETICLE = B_RETICLE + RETICLE_GAIN*(CDERROR)
- Reticles with defined offset started at 25 runs; others started at 0
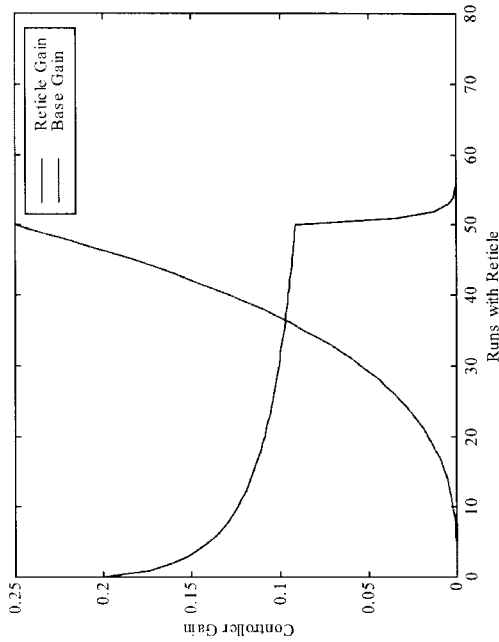

ProcessWORKS Scalability

International SEMATECH AEC/APC XII

- ProcessWORKS software is highly scalable and able to solve high product mix/multiple machine control problems
- Using relatively simple models, parameters have a flexible partitioning scheme to apportion data
- This One Control StrategyDocument has ; 1 History Partition by Logpoint (pattern level)
  - 53 machine/technology tuning partitions
  - 150 reticle partitions (orthogonal to mach/tech partitions)
- Additional partitions are automatically added the first time they are run

Ex: Reticle Offset Learning

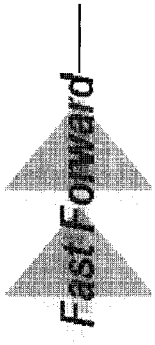

International SEMATECH AEC/APC XII

- Two new reticles (red and blue) introduced on steppers with existing base settings (square, diamond, star)
- Red reticle prints larger pattern than blue reticle, so it needs a positive exposure offset
- Reticle exposure offsets must be learned in conjunction with base exposure adjustments
- Reticle offset learned from square and diamond steppers applied to star stepper successfully

TEXAS INSTRUMENTS

THE WORLD LEADER IN DSP AND ANALOG

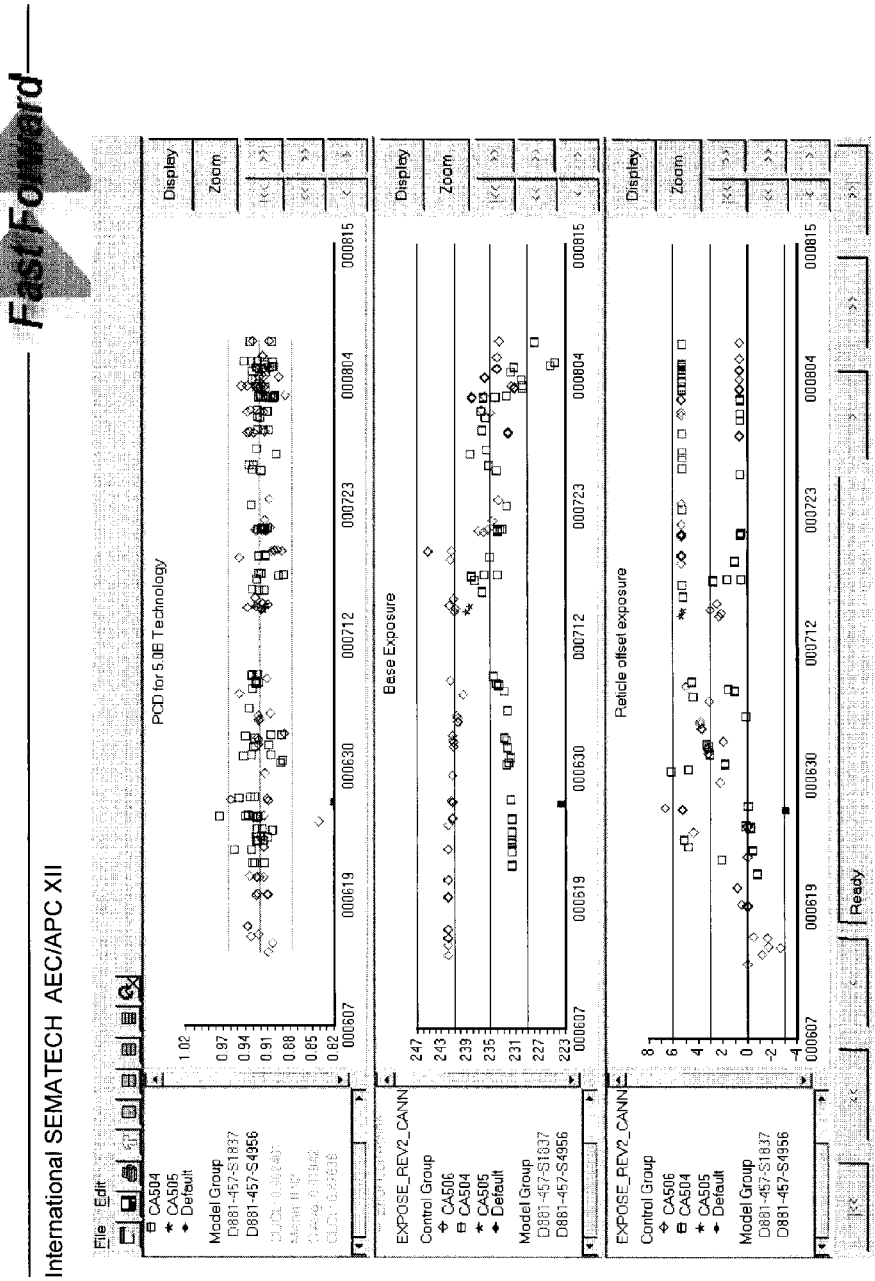

Base/Offset Interactions

International SEMATECH AEC/APC XII

*Fast Forward*

- Include all lots with all reticles, technologies run on square and diamond steppers
- Green, Light Blue, Purple reticles are from a different technology
- Base values used as starting points for red and blue reticles are from other devices in that technology that have been run previously (black)
  - Good grouping of devices into a technology makes for good starting points for new reticles
- Reticle offsets transfer between steppers

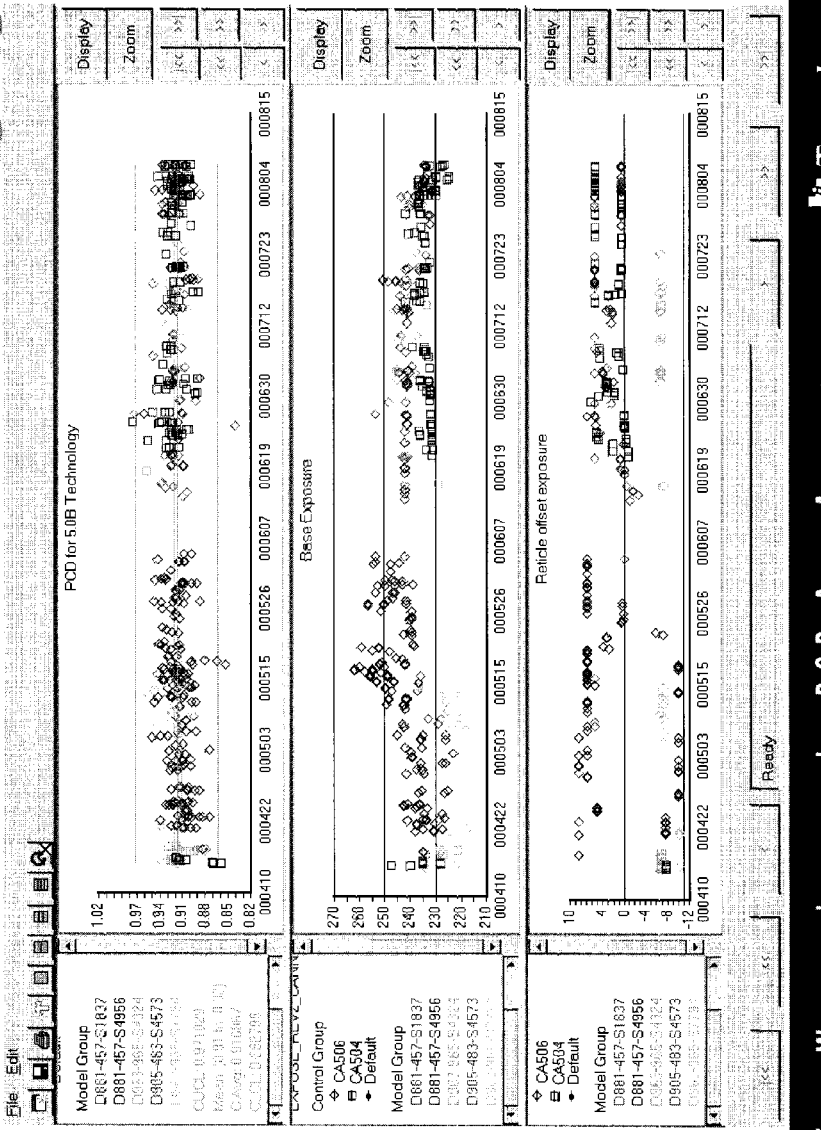

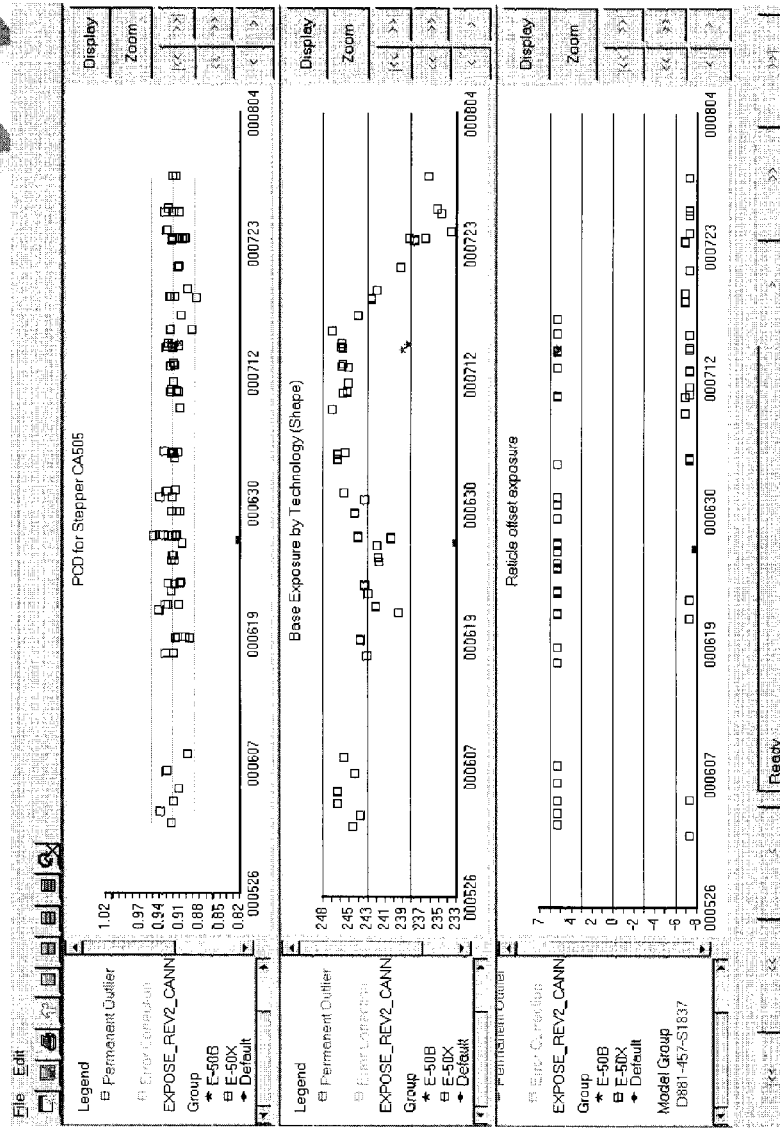

Focus Effects

International SEMATECH AEC/APC XII

- Smaller patterns (<0.35 μm) have greatly reduced Depth of Focus (DOF) in stepper operations
- Stepper focus shifts can influence the printed CD
- It is not desirable to compesate for a focus shift by adjusting the exposure
  - Sidewall profile will be affected
  - Dense/Isolated CD bias may also be affected
- A second control loop could be added to control focus
  - A second measurement is needed

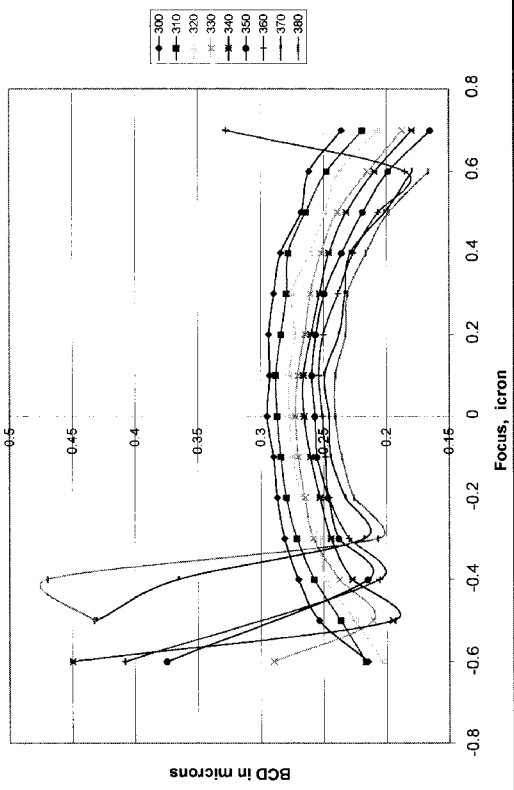

Exposure vs CD Data
International SEMATECH AEC/APC XII
- Include data only from 0.4 μm DOF
- Bottom CD is a linear function of exposure
- CD decreases on either side of best focus
  – Not clear how to adjust focus to shift BCD back on target
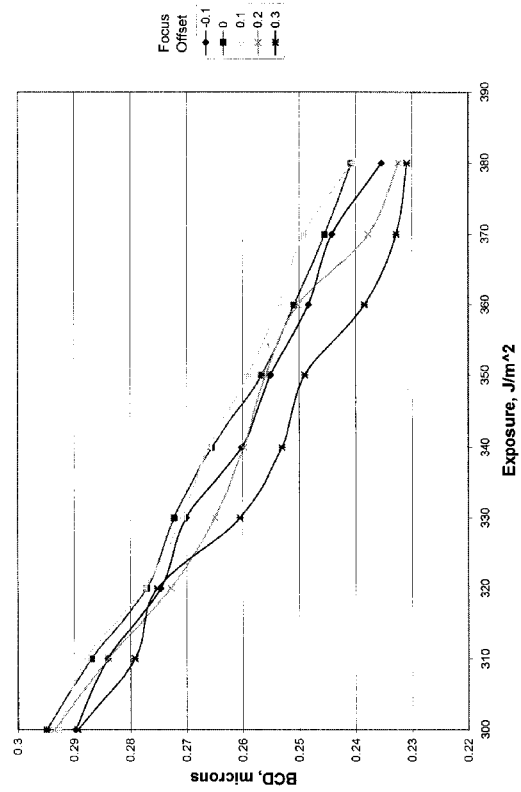

Measurement for Focus Control
International SEMATECH AEC/APC XII
- T/B ratio is linear with Focus within DOF
- T/B ratio also determines sidewall profile
- Could adjust Focus to hit T/B target, but what about effect on CD?
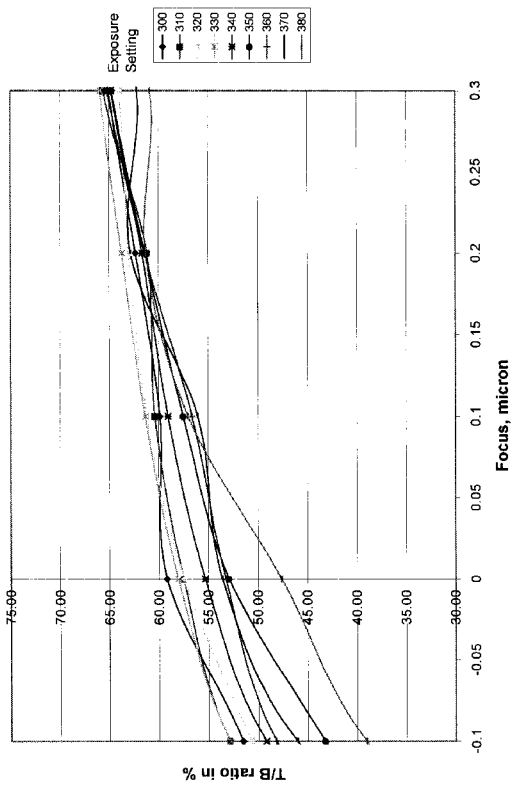

Multivariable Interactions

International SEMATECH AEC/APC XII

- A 2x2 linear model can be made for PCD and T/B ratio as a function of Exposure and Focus $$\begin{bmatrix} PCD' \\ T/B \end{bmatrix} = \begin{bmatrix} K_{11} & K_{12} \\ K_{21} & K_{22} \end{bmatrix} \begin{bmatrix} EXP' \\ FOCUS' \end{bmatrix}$$

- The degree of multivariable interactions can be assessed using the Relative Gain Array $\lambda$ $$\lambda = \frac{1}{1 - \frac{K_{12}K_{21}}{K_{11}K_{22}}}$$

- Data presented here show $K = \begin{bmatrix} -0.0007158 & -0.01618 \\ -0.1139 & 39.33 \end{bmatrix}$ ; $\lambda = 0.94$
- This implies minimal interactions between Exposure $\equiv$ BCD and Focus $\equiv$ T/B control loops

*Fast Forward*

TEXAS INSTRUMENTS
THE WORLD LEADER IN DSP AND ANALOG

Evaluating Benefits of APC

International SEMATECH AEC/APC XII

- Traditionally all product manufactured within specification limits had the same value
- Taguchi Loss function was developed to assign a cost (loss) to a part that was manufactured in spec but off target
- The value of the part should be a parabolic function with a peak at the target and zero at the specification limits instead of a rectangle

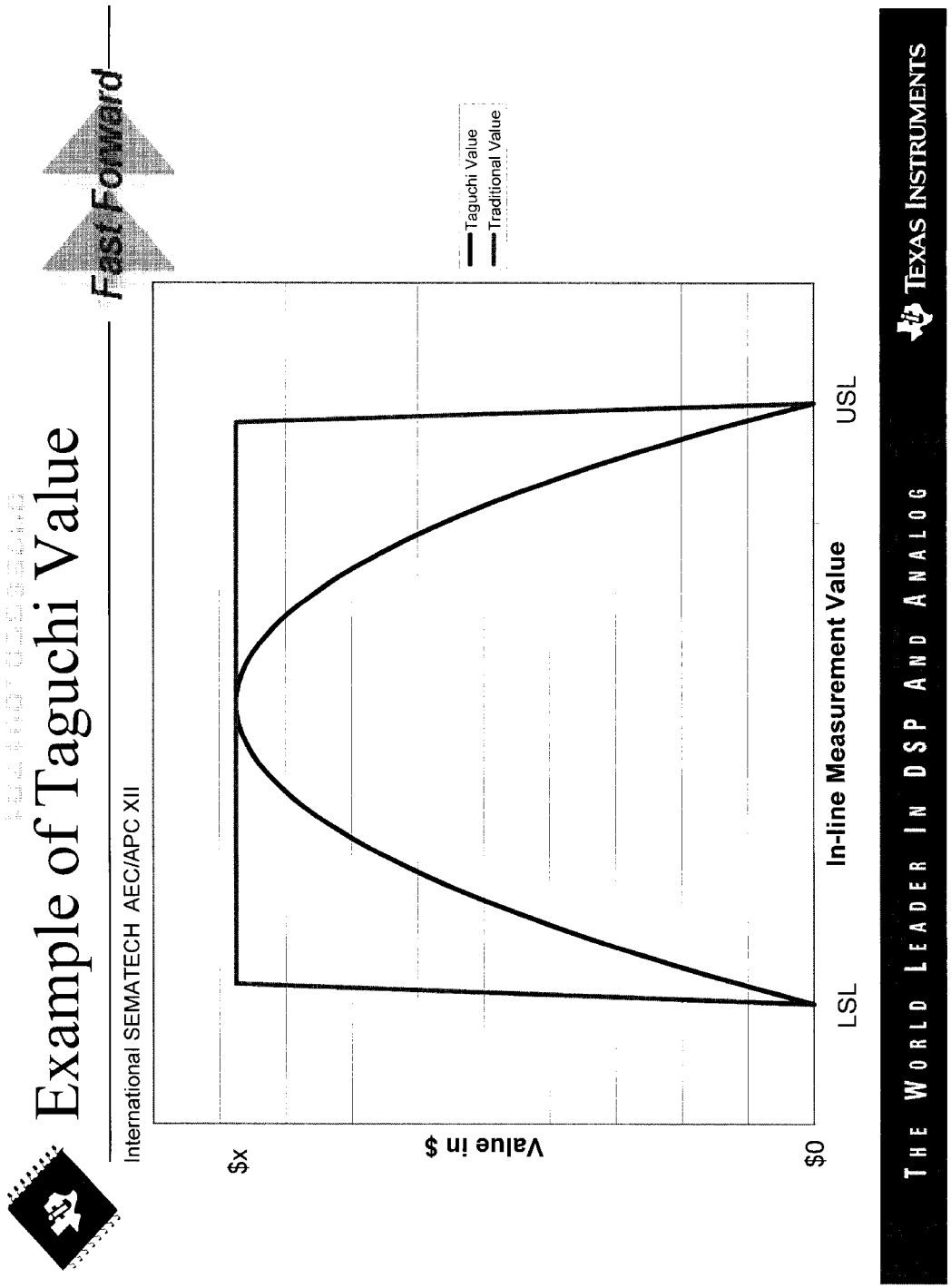

Taguchi Applied to Semiconductor Manufacturing — *Fast Forward*

International SEMATECH AEC/APC XII

- Value Added (VA) per logpoint, per wafer is the Net Revenue of the wafer divided by the number of logpoints required for its manufacture
- Taguchi's parabolic k value (in $/variance)
  $k = VA/(USL-LSL)^2$
- For a distribution with mean $\mu$ and standard deviation $\sigma$, the average loss per wafer is given by
  $loss = k*((\mu - target)^2 + \sigma^2)$
- The reduction in the loss function as the result of APC is an economic measure of success

Economic Benefits of APC Significant When Applied Broadly
International SEMATECH AEC/APC XII
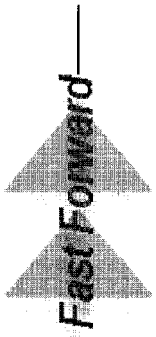
*Fast Forward*
- APC in half the DMOS4 150 mm line contributes 0.5% of revenue
List of SPC charts and before/after statistics deleted
TEXAS INSTRUMENTS
THE WORLD LEADER IN DSP AND ANALOG

Review

International SEMATECH AEC/APC XII

- Gate CD control is a critical APC application
- TI's manufacturing environment necessitates loadings with a large mix of products
- Hundreds of stepper/technology/reticle combinations create a control problem which is burdensome to a human
- ProcessWORKS provides a solution through partitioning of model parameters
- Taguchi loss function can be used to quantify the benefits of APC, which are significant when applied broadly

What is claimed is:

1. A control system for a manufacturing process, comprising:
   a first portion which identifies a first number of error components based upon data describing a lot of products being processed, and which estimates values for each of said error components based upon a second number of manufacturing feedback data values, wherein said second number may be less than said first number; and
   a second portion which communicates with said first portion and which receives said estimated values from said first portion and utilizes said estimated values to control said manufacturing process.

2. The control system of claim 1 wherein said first portion comprises an observer module and said second portion comprises a control law and process model module.

3. The control system of claim 1 wherein said manufacturing process comprises a semiconductor manufacturing process.

4. The control system of claim 3 wherein said first number of error components comprises a tool error component.

5. The control system of claim 4 wherein said first number of error components further comprises a reticle error component.

6. The control system of claim 5 wherein said first number of error components further comprises a reference tool error component.

7. The control system of claim 6 wherein said first number of error components further comprises a reference reticle error component.

8. The control system of claim 1 wherein said manufacturing feedback data values comprise numeric data values.

9. The control system of claim 8 wherein said manufacturing feedback data values further comprise process data values.

10. A system for estimating error within a semiconductor fabrication process, comprising:
    an observer which is adapted to receive context data and a second number of process and numeric data values regarding said semiconductor fabrication process, and which is further adapted to identify a first number of error components based upon said context data, and to estimate a value for each of said error components based upon said second number of process and numeric data values, wherein said second number may be less than said first number.

11. The system of claim 10 wherein said error components comprise tool error, reticle error, reference tool error, and reference reticle error.

12. The system of claim 10 wherein said controller estimates said values of said error components by use of at least one linear equation.

13. The system of claim 10 wherein said controller estimates said values of said error components by use of a least squares estimation.

14. A control system for a semiconductor photolithography overlay process, comprising:
    an observer portion which identifies a first number of error components based upon data describing a lot of wafers being processed, and which estimates values for each of said error components based upon a second number of feedback data values, wherein said second number may be less than said first number; and
    a control law and process model portion which communicates with said first portion and which receives said estimated values from said first portion and utilizes said estimated values to control said photolithography overlay process.

15. The control system of claim 14 wherein said first number of error components comprises a tool error component, a reticle error component, a reference tool error component, and a reference reticle error component.

16. The control system of claim 15 wherein said feedback data values comprise numeric data values describing post-processing measurements taken on said lot of wafers, and process data describing the photolithography overlay process.

17. A method for estimating error in a semiconductor manufacturing process comprising the steps of:
    obtaining context items data describing a lot of wafers being processed;
    identifying a a first number of error components based upon said context items data;
    obtaining process data values describing the manufacturing process;
    obtaining numeric data values describing post-processing measurements taken on said lot of wafers; and
    estimating values for each of said first number of error components by use of a second number of said process data and numeric data values, wherein said second number may be less than said first number.

18. The method of claim 17 wherein said semiconductor manufacturing process comprises a photolithography overlay process.

19. The method of claim 18 wherein said first number of error components comprises a tool component, a reticle component, a previous tool component and a previous reticle component.

20. The method of claim 17 wherein said step of estimating values for each of said first number of error components is performed by use of a least squares estimation.

21. The method of claim 17 further comprising the step of:
    determining a control input for said manufacturing process based upon said estimated error values.

22. The method of claim 21 wherein said control input is determined by use of a run-to-run controller.

23. A method for estimating error in a semiconductor manufacturing process comprising the steps of:
    obtaining context items data describing a lot of wafers being processed;
    identifying a plurality of error components based upon said context items data;
    obtaining process data describing the manufacturing process;
    obtaining numeric data describing post-processing measurements taken on said lot of wafers; and
    estimating values for each of said plurality of error components by use of said process data and numeric data, wherein said plurality of error components are estimated by use of the following set of linear equations:

$$\begin{bmatrix} A_0 \\ I \end{bmatrix} \hat{\epsilon}_{k+1} = \begin{bmatrix} b_0 \\ \hat{\epsilon}_k \end{bmatrix}$$

where $\hat{\epsilon}_{k+1}$ is a [p×1] vector of estimated values for the error components for the k+1st iteration, p is the number of error components, $\hat{\epsilon}_k$ is a [p×1] vector of estimated values of the error components for the kth iteration, $A_o$ is a [q×p] inclusion matrix for the error components, q is a predetermined number of observations in a sliding window, I is a [p×p] identity matrix, and $b_0$ is a vector of output measurements provided by the numeric data.

* * * * *

UNITED STATES PATENT AND TRADEMARK OFFICE
CERTIFICATE OF CORRECTION

PATENT NO. : 6,718,224 B2
DATED : April 6, 2004
INVENTOR(S) : Stacy Firth et al.

It is certified that error appears in the above-identified patent and that said Letters Patent is hereby corrected as shown below:

Columns 1-52,
Please delete the specification, and substitute therefore the attached specification columns 1-10.

Signed and Sealed this

Second Day of August, 2005

JON W. DUDAS
*Director of the United States Patent and Trademark Office*

SYSTEM AND METHOD FOR ESTIMATING ERROR IN A MANUFACTURING PROCESS

FIELD OF THE INVENTION

The present invention generally relates to a system and method for estimating error in a manufacturing process and more particularly, to a system and method which estimates the error between a control model and a semiconductor manufacturing process and which attributes each portion of the error to a specific contributing context item.

BACKGROUND OF THE INVENTION

Semiconductors are made in production facilities, commonly referred to as "fabs." A large fab may contain hundreds of automated tools that cooperatively work to convert circular silicon "wafers" (each consisting of dozens, hundreds, and even potentially thousands of chips) into functioning products. One of the challenges in these fabs is to control the manufacturing tools and equipment in a manner which minimizes variation and defects in the products being produced. The manufacturing equipment and tools used within these fabs, such as steppers and scanners, have a multitude of parameters which must be examined and controlled in order to minimize these variations and errors.

In addition to the errors caused by manufacturing equipment and tools, variations in product quality are often functions of the particular lot of products or wafers being processed. As a result, prior control systems for operating the manufacturing tools and processes have often been designed to use feedback data from lots that include the same type of product and that are in the same "streamline" (i.e., products that have experienced the same upstream process flow as the lot currently being processed). However, in fabs producing a relatively diverse variety of products or "high-mix" fabs, certain feedback data loops may operate with hours or even days between data points in the feedback loop. Process tool disturbances that occur during this "downtime" are not captured in the feedback data. As a result, these delays may cause a loss of information regarding the manufacturing tools' respective contributions to the variance in a specific product.

Moreover, prior fabrication control systems do no partition the error into its contributing context items or component parts, such as the specific error components related to the current and previous manufacturing tools and reticles that were used on a product. That is, these conventional systems only generally identify an overall or cumulative error, and do not provide information as to the various elements or items which cooperate to produce the error. Hence, the ability to optimize the manufacturing process and to provide corrective measures to prevent errors in future fabrications or processes is substantially limited.

Some efforts have been made to partition manufacturing errors into their respective components through the use of a conventional sliding mode control law (e.g., a control law implementing a sliding gain). These efforts have had limited success. Particularly, these prior methods have only been capable of identifying two context items. Furthermore, the sliding gains utilized within these prior methods result in a loss of information in one or more individual components of the error estimate, which increases as the sliding gain approaches zero (i.e., as more and more lots are processed through the system).

It is therefore desirable to provide a system and method for estimating error within a semiconductor fabrication process, which overcomes the drawbacks and limitations of prior systems and methods, which estimates the error between a control model and a semiconductor manufacturing process, and which attributes each portion of the error to a specific contributing context item.

SUMMARY OF THE INVENTION

The present invention provides many advantages over conventional error estimation methods and systems. By way of example and without limitation, the present invention accurately estimates the error within a semiconductor manufacturing process and attributes each portion of the error to a specific contributing context item (i.e., a specific component that contributes to the overall error). Furthermore, in one non-limiting embodiment, the present invention is effective to partition the overall error into four separate contributing context items. Moreover, the present invention does not require the use of a sliding gain and continues to re-estimate all components of variation throughout the application of the method.

According to one aspect of the present invention, a control system is provided for a manufacturing process. The control system includes a first portion which identifies a plurality of error components based upon data describing a lot of products being processed, and which estimates values for each of the error components based upon manufacturing feedback data; and a second portion which communicates with the first portion and which receives the estimated values from the first portion and utilized the estimated values to control the manufacturing process.

According to a second aspect of the present invention, a system is provided for estimating errors with a semiconductor fabrication process. The system includes a controller which is adapted to receive context data, process data and numeric data regarding the semiconductor fabrication process, and which is further adapted to identify an optimal number of error components based upon the context data, and to estimate a value for each of the error components based upon the process data and numeric data.

According to a third aspect of the present invention, a method is provided for estimating errors in a semiconductor manufacturing process. The method includes the steps of: obtaining context items data describing a lot of wafers being processed; identifying a plurality of error components based upon the context items data; obtaining process data describing the manufacturing process; obtaining numeric data describing post-processing measurements taken on the lot of wafers; and estimating values for each of the plurality of error components by use of the process data and numeric data.

These and other features and advantages of the invention will become apparent by reference to the following specification and by reference to the following drawings.

BRIEF DESCRIPTION OF THE DRAWINGS

FIG. 1 is a block diagram illustrating a semiconductor fabrication control system in accordance with a preferred embodiment of the present invention.

FIG. 2 is a block diagram illustrating the methodology employed by the preferred embodiment of the invention.

FIG. 3 is a graph of data taken during a first simulation and illustrating the cumulative sum of squares error for a control system employing the present invention and for a control system employing a conventional exponentially weighted moving average ("EWMA") method.

FIG. 4 is a graph of data taken during a first simulation and illustrating the state estimation provided by a control system employing the present invention and by a control system employing a conventional exponentially weighted moving average method.

FIG. 5 is a graph of data taken during a second simulation and illustrating the cumulative sum of squares error for a control system employing the present invention and for a control system employing a conventional exponentially weighted moving average method.

DETAILED DESCRIPTION OF A PREFERRED EMBODIMENT OF THE INVENTION

The present invention provides a system and method for estimating error in a manufacturing process and for attributing the error to a plurality of component parts. In the preferred embodiment, the present invention comprises and/or resides within the observer portion of a run-to-run control system that controls the overall operation of a semiconductor manufacturing process. Particularly, the invention may be implemented within and/or form a portion of the software and/or hardware which forms the manufacturing control system.

Referring now to FIG. 1, there is shown a control system 10 that includes an observer portion or module 12 in accordance with a preferred embodiment of the present invention. As should be appreciated by one of ordinary skill in the art, control system 10 is a run-to-run control system. Control system 10 may represent one or more conventional and commercially available controllers, computers, manufacturing execution systems, or independent microprocessor-based systems built specifically for use with the present invention.

As described more fully and completely below, the observer portion or module 12 is adapted to estimate the actual state of the fabrication process, to estimate errors that are correlated with a plurality of contributing context items (i.e., components that contribute to the overall error, such as tool error, reticle error, reference tool error and reference reticle error), and to generate updated process state information. The observer portion 12 then communicates this information to a control law and process model portion 14. The "control law" of portion 14 utilizes the error information from observer portion 12 to determine how the fabrication process or "recipe" should be modified in order to keep the process (e.g., the output of the process or the fabricated devices) on target. The "process model" of portion 14 relates measurable inputs and states to the desired product qualities. Particularly, the process model is used in the control law to determine which recipe parameters, or process inputs, should be adjusted to provide the desired output.

The output from the control law and process model portion 14 (i.e., the process inputs) is communicated to the fabrication process 16 (e.g., to the manufacturing tools performing the fabrication process). The fabrication process 16 is then modified in accordance with the information or process inputs received from portion 14.

The modified process 16 provides process outputs in the form of fabricated or processed products or devices. Data is measured or obtained from the fabricated or processed products and is utilized as feedback information which is communicated to the observer portion 12.

To better understand the operation of the preferred embodiment of the invention, reference is now made to FIG. 2. FIG. 2 is a block diagram 30 illustrating the functionality, method or strategy used by the control 10 to estimate the error or process variation between the control or process model used within the run-to-run control system and the semiconductor fabrication process. The present invention implements a "just-in-time adaptive disturbance estimation" ("JADE") strategy to identify the contributions to variation that are dependent upon a plurality of specific context items or error components. The strategy 30 is briefly executed as follows: the observer portion 12, in a conventional manner, of the control system 10 receives context items data in functional block or step 32; identifies a plurality of error components in functional block or step 34; receives process data in functional block or step 36; receives numeric data in functional block or step 38; estimates the value of the error components for the manufacturing process in functional block or step 40 based upon the received context, process and numeric data; and communicates the error information to the control law and process model portion 14 of the run-to-run controller in functional block or step 42. The function and/or operation of each of the foregoing steps is discussed more fully and completely below.

In functional block or step 32, the observer portion 12 of control system 10 receives context items data regarding the group or lot of wafers that is being processed. The context items data is typically received from a fab's manufacturing execution system, or alternatively, may inputted into system 10 in a conventional manner by a control or manufacturing engineer. The context items data includes data describing the route or flow that a particular lot or group of wafers will follow in the fab (e.g., the sequence of tools and processes that the lot will encounter and undergo), the reticles that will be used on the lot, and other information regarding each lot of wafers being processed.

In functional block or step 34, the observer portion 12 determines an optimal number of error components that will be identified based upon the received context items data. Particularly, the observer portion 12 determines the number and identity of the components of variation or error that will be estimated, based upon the context items data, in a manner that is well-known in the art. As an example, system 10 may by designed for controlling a photolithography overlay process, and may identify the following four contributing error components: tool error (e.g., error relating to the present tool being used on the wafer), reticle error (e.g., error relating to the present reticle being used on the wafer), reference tool error (e.g.. error relating to the previous or last tool that was used on the wafer), and reference recticle error (e.g., error relating to the previous or last reticle that was used on the wafer). In other alternate embodiments, different and/or additional error components may be identified based upon the particular process being modeled or controlled.

In functional block or step 36, the observer portion 12 receives data describing the particular processes that the lot of wafers encounters during fabrication. This process data may include information regarding tool and/or machine settings and operating points existing during the fabrication process, such as temperature and pressure settings, spin speeds and other tool and/or machine operating parameters. The process data may be obtained and communicated to the observer 12, in a conventional manner, as feedback from the fabrication tools and/or the manufacturing execution system.

In functional block or step 38, the observer portion 12 receives numeric data representing output measurements from a lot of wafers that are obtained after a processing operation is complete. This numeric data may include by way of example and without limitation, wafer thickness measurements, heights and widths of resident wafer structures, electrical properties of resident wafer elements, and any other relevant parametric data. This data may be obtained by use of conventional sensors and testing devices and may be communicated to observer portion 12 by the sensors, testing devices, manufacturing execution system or in any other suitable manner.

In functional block or step 40, observer portion 12 estimates the value of each of the error components identified in step 34. This estimation is used within the control system's run-to-run process model or algorithm which is represented by the following equation:

$$y_k = \alpha u_k + \epsilon_{tot,k} \qquad \text{Equation (1)}$$

where $y_k$ is the measured output of the fabrication process for batch k, $u_k$ is the process input based, in a known manner, on previous observations through batch k, $\alpha$ is a predetermined parameter selected to model the relevant fabrication process, and $\epsilon_{tot,k}$ is the total error of the fabrication process, estimated after each lot.

The observer 12 partitions the total error, $\epsilon_{tot,k}$ into its component parts according to the following equation:

$$\epsilon_{tot} = \sum_i \epsilon_i \qquad \text{Equation (2)}$$

where the summation is over the identified context items or error components. For example, in an embodiment designed for use with a photolithography overlay process, Equation (2) would be written as follows:

$$\epsilon_{tot} = \epsilon_{tool} + \epsilon_{reticle} + \epsilon_{ref\_tool} + \epsilon_{ref\_reticle} \qquad \text{Equation (3)}$$

The observer 12 estimates each of the foregoing component errors after each lot of wafers is processed. Observer 12 generates these estimates by use of the following mathematical computations. For p individual context items (e.g., tool, reticle, reference tool and reference reticle in one embodiment) and a sliding window of q observations, a set of linear equations is constructed by use of the following equation:

$$\begin{bmatrix} A_0 \\ I \end{bmatrix} \hat{\epsilon}_{k+1} = \begin{bmatrix} b_0 \\ \hat{\epsilon}_k \end{bmatrix} \qquad \text{Equation (4)}$$

where $\hat{\epsilon}_{k+1}$ is a [p×1] vector of context-based error estimates for the k+1st iteration; $\hat{\epsilon}_k$ is a [p×1] vector of context-based error estimates for the kth iteration; $A_0$ is a [q×p] "inclusion" matrix of "1s" and "0s" for inclusion of the relevant context items in the total error which is determined based upon the context data; I is a [p×p] identity matrix; and $b_0$ is a vector of measurements (i.e., $y_{k+1}$) provided by the numeric data. In the preferred embodiment, the error estimates $\hat{\epsilon}_k$ may be initialized according to a predetermined hierarchy. Particularly, one error component (e.g., tool error) may be assigned the actual total error value, and the remaining error components may be set to zero. After several iterations, the observer 12 will provide substantially accurate values for all error components.

Equation (4) is modified by the inclusion of a weighting matrix, Q, thereby providing the following equation:

$$QA\hat{\epsilon}_{k+1} = Qb \qquad \text{Equation (5)}$$

where $$A = \begin{bmatrix} A_0 \\ I \end{bmatrix}, b = \begin{bmatrix} b_0 \\ \hat{\epsilon}_k \end{bmatrix}.$$

and Q is defined by $$Q = \begin{bmatrix} Q_1 & Q_2 \\ Q_3 & Q_4 \end{bmatrix} \qquad \text{Equation (6)}$$

In Equation (6), $Q_1$ is a [q×q] matrix and $Q_4$ is a [p×p] matrix as shown below:

$$Q_1 = \begin{bmatrix} \lambda & 0 & \cdots & 0 \\ 0 & \lambda^2 & & \vdots \\ \vdots & & \ddots & 0 \\ 0 & \cdots & 0 & \lambda^q \end{bmatrix}, \qquad \text{Equation (7)}$$

$$Q_4 = \begin{bmatrix} (1-\lambda) & 0 & \cdots & 0 \\ 0 & (1-\lambda) & & \vdots \\ \vdots & & \ddots & 0 \\ 0 & \cdots & 0 & (1-\lambda) \end{bmatrix}$$

where $\lambda$ is an adjustable tuning parameter, and $Q_2$ and $Q_3$ are matrices of zeros with sizes [q×p] and [p×q], respectively. Equation (5) is solved for the context-based errors using a conventional least-squares estimation, resulting in the following realization of the normal equations:

$$\hat{\epsilon}_{k+1} = (A^T Q^T Q A)^{-1} A^T Q^T Q b \qquad \text{Equation (8)}$$

where the superscript T denotes the matrix transposition function, and the superscript −1 denotes the matrix inversion function.

Equation (8) is solved at each iteration of the control algorithm and in functional block or step 42, observer portion 12 communicates this error information to portion 14 of the control system 10. Control system 10 utilizes this information within the control law of portion 14 which is represented by the following equation:

$$u_k = \frac{T - \hat{\epsilon}_{tot,k}}{\alpha} \qquad \text{Equation (9)}$$

where T is the process target. The control law calculates the recommended process input which is utilized within the manufacturing process 16. The resulting process and numeric data is obtained and provided to the observer 12 as feedback for subsequent iterations.

The foregoing control system 10 was tested in comparison with a traditional streamlined exponentially weighted moving average ("EWMA") system. Particularly, a pair of simulations were performed using the present control system 10 (i.e., the JADE system) and an EWMA system. As shown by the graphs of FIGS. 3–5, the JADE system performed better than the traditional EWMA system.

Graph 100 of FIG. 3 and graph 110 of FIG. 4 illustrate results obtained during a first simulation. During the first simulation, four context items (i.e., tool, reticle, previous tool and previous reticle) were identified and used, with each context item having two possible values (e.g., two possible tool values, two possible reticle values, two possible previous tool values, and two possible previous reticle values). Additionally, a sliding estimation window of five lots was used. As shown by graph 100, the sum of squares error ("SSE") of the JADE system is substantially less than the SSE of the traditional EWMA system. For example, the final SSE for the EWMA system is approximately 1.01, while the final SSE for the JADE system is approximately 0.68. Moreover, as shown by graph 110 of FIG. 4, the state estimation provided by the JADE system is consistently closer to the actual state of the process than the state estimation provided by the traditional EWMA system.

In the second simulation, two context items (i.e., tool and reticle) were identified and used. The tool context item had two possible values and the reticle context item had three possible values. Additionally, a sliding window of five lots was used. As shown by graph 120 of FIG. 5, the SSE of the JADE system is less than the SSE of the traditional EWMA system. For example, the final SSE for the EWMA system is approximately 0.246, while the final SSE for the JADE system is approximately 0.234.

In the foregoing manner, the present invention accurately estimates the error within a semiconductor manufacturing process and attributes each portion of the error to a specific contributing context item. Hence, the present system and method offer insight into which context items are varying, thereby providing specific guidance for improving the manufacturing process and eliminating variation. The present invention performs state estimation superior to conventional EWMA systems, and has a consistently lower SSE than conventional EWMA systems. Moreover, the present invention does not require the use of sliding gains and continues to re-estimate all components of variation throughout the application of the algorithm.

It should be understood that the inventions described herein are provided by way of example only that numerous changes, alterations, modifications, and substitutions may be made without departing from the spirit and scope of the inventions as delineated within the following claims.

What is claimed is:

1. A control system for a manufacturing process, comprising:
    a first portion which identifies a first number of error components based upon data describing a lot of products being processed, and which estimates values for each of said error components based upon a second number of manufacturing feedback data values, wherein said second number may be less than said first number; and
    a second portion which communicates with said first portion and which receives said estimated values from said first portion and utilizes said estimated values to control said manufacturing process.

2. The control system of claim 1 wherein said first portion comprises an observer module and said second portion comprises a control law and process model module.

3. The control system of claim 1 wherein said manufacturing process comprises a semiconductor manufacturing process.

4. The control system of claim 3 wherein said first number of error components comprises a tool error component.

5. The control system of claim 4 wherein said first number of error components further comprises a reticle error component.

6. The control system of claim 5 wherein said first number of error components further comprises a reference tool error component.

7. The control system of claim 6 wherein said first number of error components further comprises a reference reticle error component.

8. The control system of claim 1 wherein said manufacturing feedback data values comprise numeric data values.

9. The control system of claim 8 wherein said manufacturing feedback data values further comprise process data values.

10. A system for estimating error within a semiconductor fabrication process, comprising:
    an observer which is adapted to receive context data and a second number of process and numeric data values regarding said semiconductor fabrication process, and which is further adapted to identify a first number of error components based upon said context data, and to estimate a value for each of said error components based upon said second number of process and numeric data values, wherein said second number may be less than said first number.

11. The system of claim 10 wherein said error components comprise tool error, reticle error, reference tool error, and reference reticle error.

12. The system of claim 10 wherein said controller estimates said values of said error components by use of at least one linear equation.

13. The system of claim 10 wherein said controller estimates said values of said error components by use of a least squares estimation.

14. A control system for a semiconductor photolithography overlay process, comprising:
    an observer portion which identifies a first number of error components based upon data describing a lot of wafers being processed, and which estimates values for each of said error components based upon a second number of feedback data values, wherein said second number may be less than said first number; and
    a control law and process model portion which communicates with said first portion and which receives said estimated values from said first portion and utilizes said estimated values to control said photolithography overlay process.

15. The control system of claim 14 wherein said first number of error components comprises a tool error component, a reticle error component, a reference tool error component, and a reference reticle error component.

16. The control system of claim 15 wherein said feedback data values comprise numeric data values describing post-processing measurements taken on said lot of wafers, and process data describing the photolithography overlay process.

17. A method for estimating error in a semiconductor manufacturing process comprising the steps of:
    obtaining context items data describing a lot of wafers being processed;
    identifying a first number of error components based upon said context items data;
    obtaining process data values describing the manufacturing process;
    obtaining numeric data values describing post-processing measurements taken on said lot of wafers; and
    estimating values for each of said first number of error components by use of a second number of said process data and numeric data values, wherein said second number may be less than said first number.

18. The method of claim 17 wherein said semiconductor manufacturing process comprises a photolithography overlay process.

19. The method of claim 18 wherein said first number of error components comprises a tool component, a reticle component, a previous tool component and a previous reticle component.

20. The method of claim 17 wherein said step of estimating values for each of said first number of error components is performed by use of a least squares estimation.

21. The method of claim 17 further comprising the step of:
determining a control input for said manufacturing process based upon said estimated error values.

22. The method of claim 21 wherein said control input is determined by use of a run-to-run controller.

23. A method for estimating error in a semiconductor manufacturing process comprising the steps of:
obtaining context items data describing a lot of wafers being processed;
identifying a plurality of error components based upon said context items data;
obtaining process data describing the manufacturing process;
obtaining numeric data describing post-processing measurements taken on said lot of wafers; and
estimating values for each of said plurality of error components by use of said process data and numeric data, wherein said plurality of error components are estimated by use of the following set of linear equations:

$$\begin{bmatrix} A_0 \\ \overline{I} \end{bmatrix} \hat{\epsilon}_{k+1} = \begin{bmatrix} b_0 \\ \overline{\hat{\epsilon}_k} \end{bmatrix}$$

where $\hat{\epsilon}_{k+1}$ is a [p×1] vector of estimated values for the error components for the k+1st iteration, p is the number of error components, $\hat{\epsilon}_k$ is a [p×1] vector of estimated values of the error components for the kth iteration, $A_0$ is a [q×p] inclusion matrix for the error components, q is a predetermined number of observations in a sliding window, I is a [p×p] identity matrix, and $b_0$ is a vector of output measurements provided by the numeric data.

* * * * *